US011218580B2

(12) United States Patent
Davis

(10) Patent No.: US 11,218,580 B2
(45) Date of Patent: Jan. 4, 2022

(54) MULTI-POSITIONING COMMUNICATION DEVICE HOLDING SYSTEM

(71) Applicant: BioRhythmic Gear LLC, Alexandria, VA (US)

(72) Inventor: Jeremy J. Davis, Alexandria, VA (US)

(73) Assignee: BioRhythmic Gear LLC, Alexandria, VA (US)

( * ) Notice: Subject to any disclaimer, the term of this patent is extended or adjusted under 35 U.S.C. 154(b) by 0 days.

(21) Appl. No.: 17/013,699

(22) Filed: Sep. 7, 2020

(65) Prior Publication Data

US 2021/0099556 A1 Apr. 1, 2021

Related U.S. Application Data

(60) Provisional application No. 62/908,749, filed on Oct. 1, 2019.

(51) Int. Cl.
| | | |
|---|---|---|
| H04M 1/02 | (2006.01) | |
| G06F 1/16 | (2006.01) | |
| H05K 5/02 | (2006.01) | |

(52) U.S. Cl.
CPC .......... *H04M 1/026* (2013.01); *G06F 1/1632* (2013.01); *H05K 5/0204* (2013.01)

(58) Field of Classification Search
CPC ...... F16M 11/041; F16M 11/10; F16M 13/04; F16M 2200/024; G06F 1/1626; G06F 1/163; G06F 1/1632; H04B 1/385; H04M 1/026; H04M 1/04; H05K 5/0204

USPC ..... 455/575.1, 575.8, 556.1; 248/309.1, 551, 248/288.11, 274.1; 403/300; 340/573.1
See application file for complete search history.

(56) References Cited

U.S. PATENT DOCUMENTS

| | | | | |
|---|---|---|---|---|
| 6,427,959 B1* | 8/2002 | Kalis | ...................... | H04M 1/04 248/288.11 |
| 8,604,931 B1* | 12/2013 | Veloso | ..................... | H04M 1/04 340/573.1 |
| 9,167,062 B1* | 10/2015 | Leibenhaut | ......... | H04M 1/6041 |
| 2006/0231713 A1* | 10/2006 | Crain | ..................... | F16M 11/10 248/309.1 |
| 2006/0231714 A1* | 10/2006 | Crain | ..................... | F16M 11/10 248/309.1 |
| 2006/0233601 A1* | 10/2006 | Crain | ........................ | E06C 7/14 403/300 |
| 2011/0019992 A1* | 1/2011 | Orf | ......................... | H04M 1/04 396/419 |
| 2011/0170246 A1* | 7/2011 | Chu | ...................... | F16M 11/041 361/679.01 |
| 2013/0277521 A1* | 10/2013 | Hiramoto | ............... | F16M 13/00 248/274.1 |
| 2014/0360893 A1* | 12/2014 | Whitten | .................. | B62J 11/00 206/45.2 |

(Continued)

*Primary Examiner* — Tan H Trinh
(74) *Attorney, Agent, or Firm* — Peter J. Van Bergen

(57) ABSTRACT

A communication device holding system includes a base having a planar face, a mounting face, and a peripheral edge. The base includes slots adjacent to the peripheral edge with each of the slots extending through the base from its planar face to its mounting face. The peripheral edge is discontinuous at portions thereof to define openings in the peripheral edge wherein each of the slots has one of the openings in open communication therewith. The system also includes a device holder adjustably coupled to the mounting face and adapted to hold a communication device.

20 Claims, 7 Drawing Sheets

(56) References Cited

U.S. PATENT DOCUMENTS

2015/0300050 A1* 10/2015 Van Balen ............ A47F 5/0087
 248/551
2017/0314732 A1* 11/2017 Minn .................. B60R 11/0252
2020/0107653 A1* 4/2020 Leyden ............... E05B 73/0082

* cited by examiner

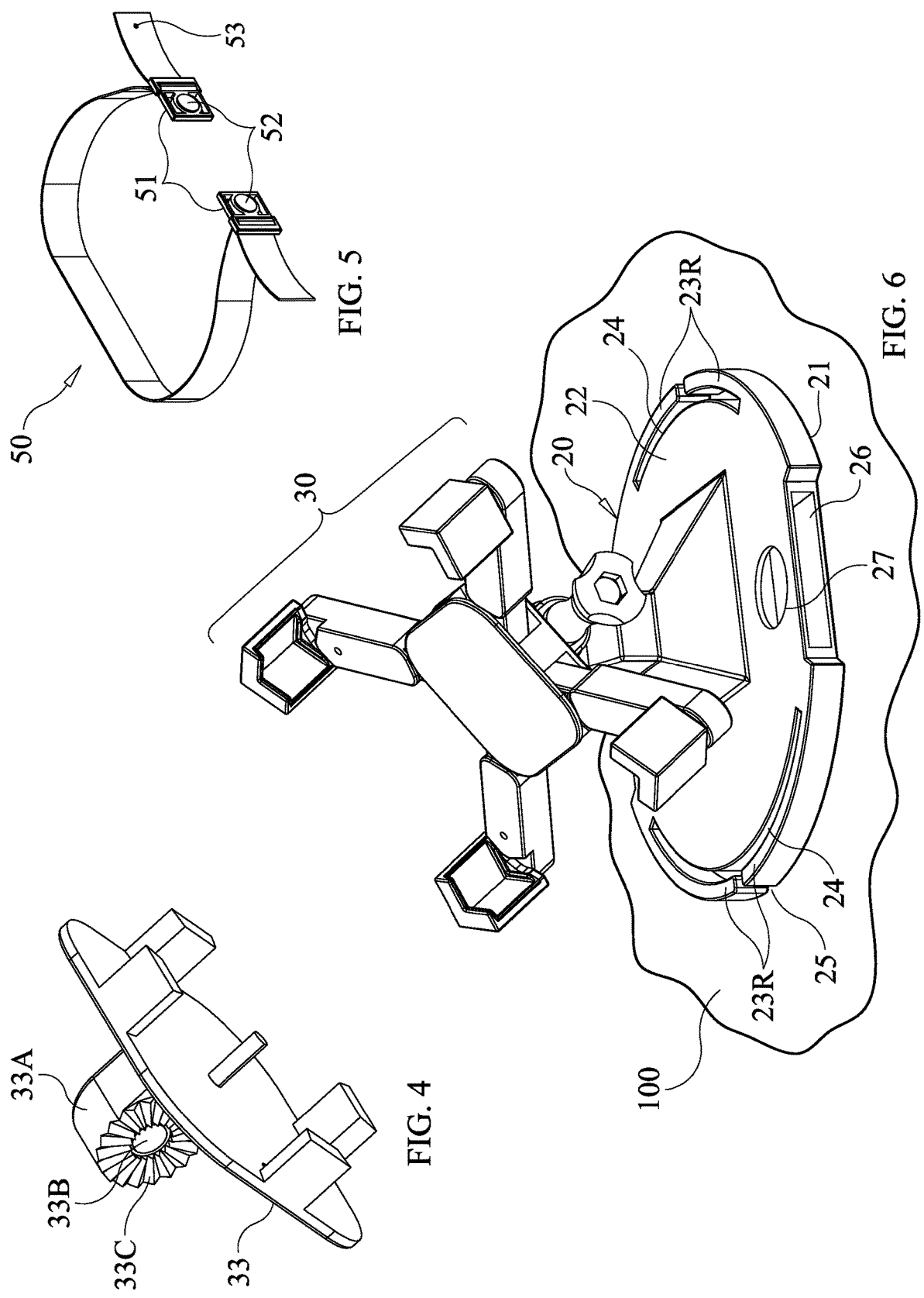

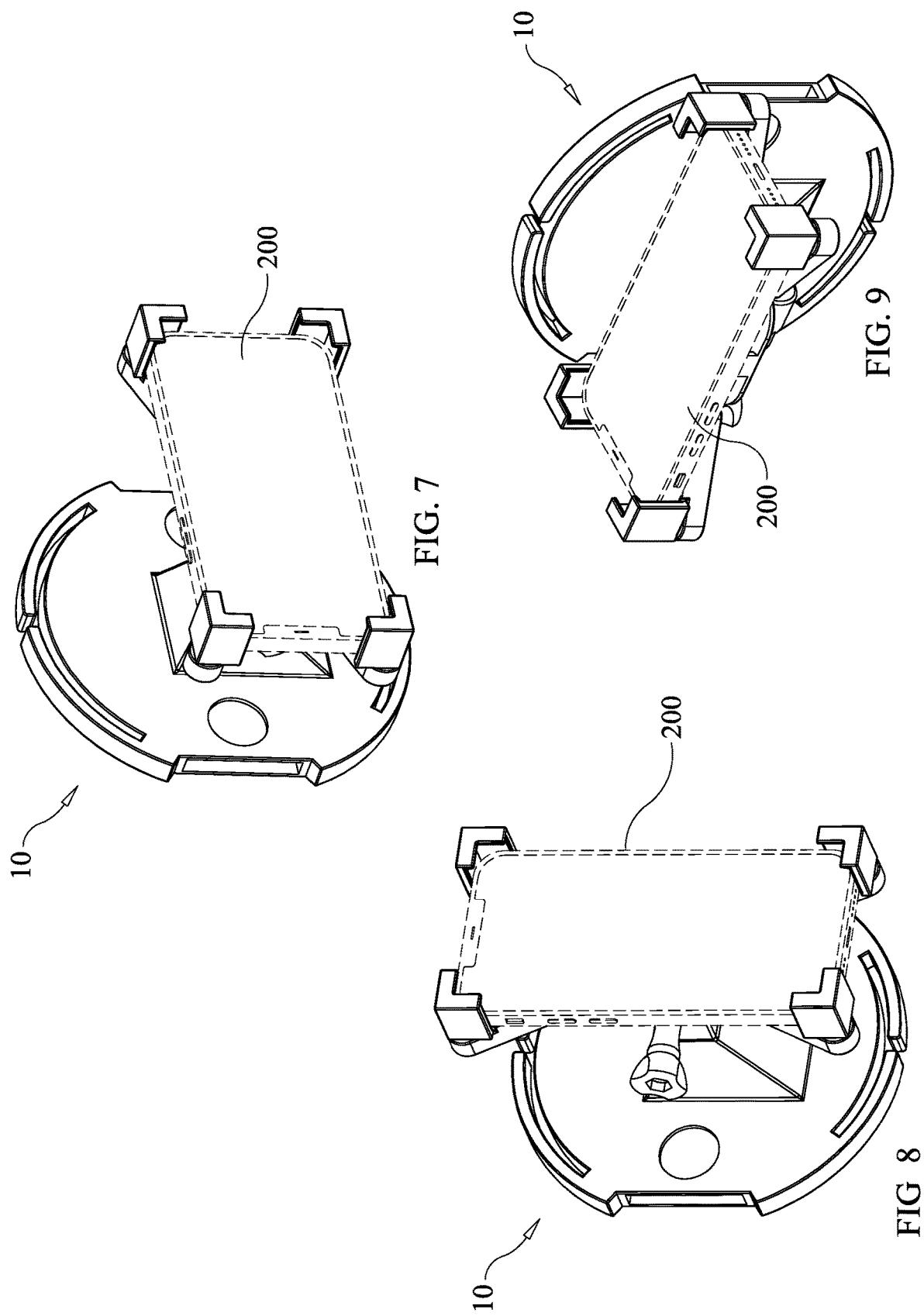

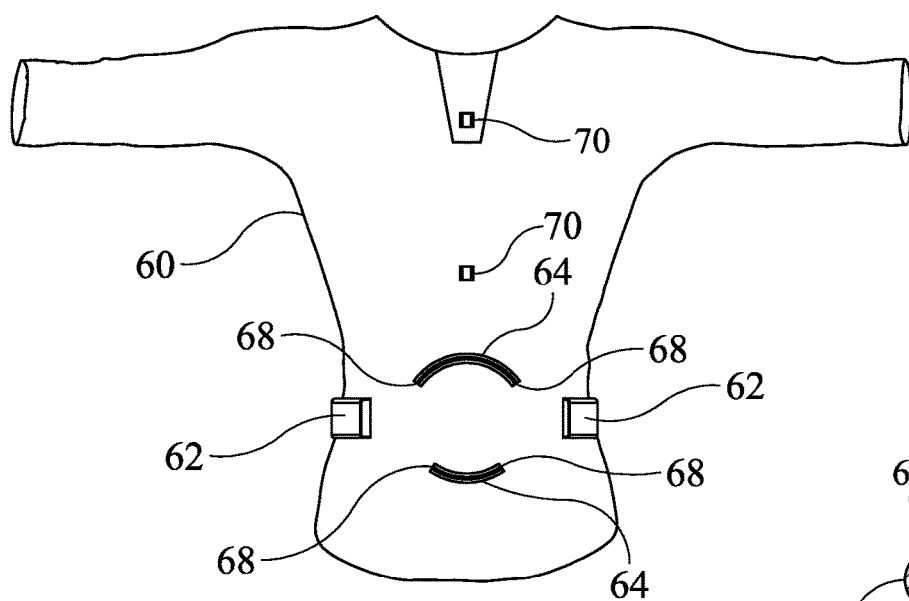
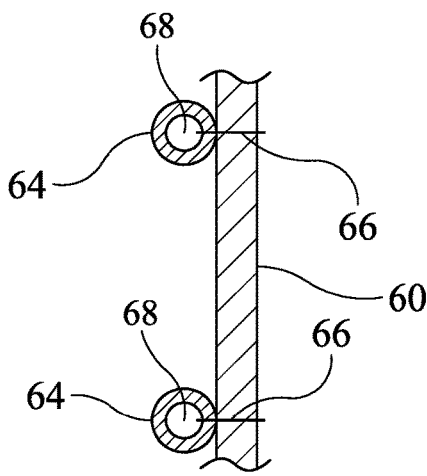
FIG. 10
FIG. 11
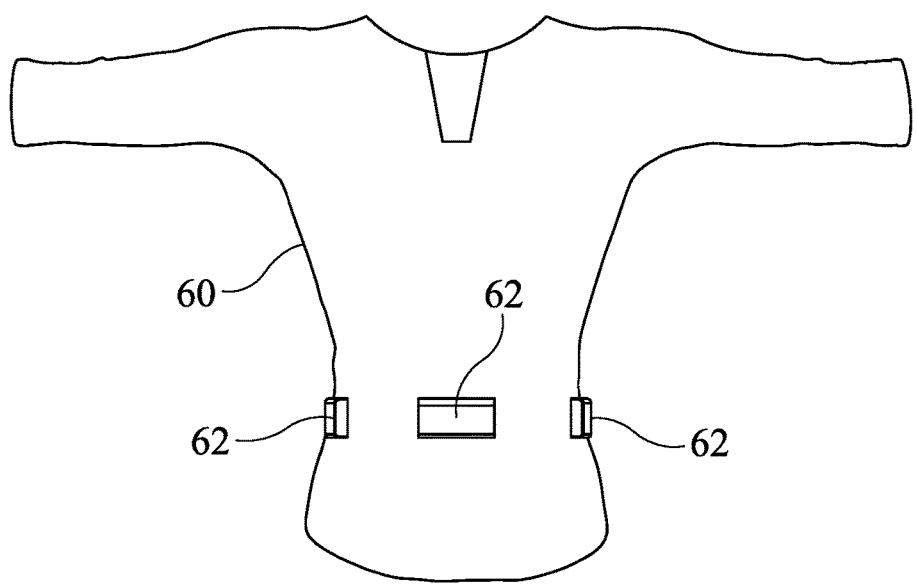
FIG. 12

MULTI-POSITIONING COMMUNICATION DEVICE HOLDING SYSTEM

Pursuant to 35 U.S.C. § 119, the benefit of priority from provisional application 62/908,749, with a filing date of Oct. 1, 2019, is claimed for this non-provisional application.

FIELD OF THE INVENTION

The invention relates generally to holders for communication devices such as smartphones, and more particularly to a free-standing and wearable communication device holding system that allows a communication device to be re-positioned for easy viewing and access in a variety of hands-free configurations.

BACKGROUND OF THE INVENTION

The types of people participating in routine or daily physical activity range from those who are passionate about their workouts to those who are more casual in their approach to physical activity. Similarly, the types of physical activity that people participate in include a wide variety of indoor and outdoor training activities, recreational activities, and work activities. Still further, the goals of those participating in physical activity include relaxation, performance of one's job tasks, achieving a certain number of daily steps, and/or achieving event-performance improvements. However, for all of the different types of activities, their participants, and the goals of participation, there is a general desire to have ready access to one's smartphone.

Today's smartphone provides a user with several communication options, but also provides a user with information they may want or need to access to during the course of their activity, e.g., workout or instructional routines or videos, motivational audio to include a trainer's instructions and/or music, audio and/or video chats, etc. Since placing one's smartphone in a pocket is not always possible or practical during physical activity, a variety of hands-free holders for smartphones are available ranging from arm band holders to those that clip onto one's belt to those designed to wrap around one's neck, chest, or waist. However, each of these holders places one's smartphone in a position that makes it difficult or impossible to see or access the device's screen thereby requiring the user to remove the smartphone from the holder, grab the holder and try to manipulate the holder with the phone attached to it, or remove the holder and smartphone to see the screen to make changes to the smartphone's operations. In other situations, a user may prefer to have their smartphone positioned on a flat surface (e.g., table, shelf, floor, etc.) adjacent to where their activity is taking place. However, just placing a smartphone on a flat surface does not always provide for optimum access or viewing.

SUMMARY OF THE INVENTION

Accordingly, it is an object of the present invention to provide a holding system for a smartphone or other communication device.

Another object of the present invention is to provide a smartphone holding system that can be used during a variety of activities.

Still another object of the present invention is to provide a smartphone holding system that allows a smartphone to be positioned for ready visual and physical access without removing the smartphone from the holding system.

A still further object of the present invention is to provide a smartphone holding system that allows a user to record videos in a hands-free fashion from a variety of angles.

Yet another object of the present invention is to provide a smartphone holding system that can be worn by a user or used as a stand-alone device.

Other objects and advantages of the present invention will become more obvious hereinafter in the specification and drawings.

In accordance with one aspect of the present invention, a communication device holding system includes a base having a planar face, a mounting face, and a peripheral edge. The base includes slots adjacent to the peripheral edge with each of the slots extending through the base from its planar face to its mounting face. The peripheral edge is discontinuous at portions thereof to define openings in the peripheral edge wherein each of the slots has one of the openings in open communication therewith. Each such opening extends through the base from its planar face to its mounting face. The system also includes a device holder coupled to the mounting face and adapted to hold a communication device. The device holder is adjustable in position relative to the mounting face.

In accordance with another aspect of the present invention, the communication device holding system further includes a wearable garment such as a shirt. At least one tube is coupled to the garment for engagement in one of the slots via the opening associated therewith.

BRIEF DESCRIPTION OF THE DRAWINGS

Other objects, features and advantages of the present invention will become apparent upon reference to the following description of the preferred embodiments and to the drawings, wherein corresponding reference characters indicate corresponding parts throughout the several views of the drawings and wherein:

FIG. 4 is an isolated perspective view of the arm assembly's rear cover plate in accordance with an embodiment of the present invention;

FIG. 5 is an isolated perspective view of a belt for use in strapping the communication device holding system to one's waist or chest in accordance with an embodiment of the present invention;

FIG. 6 is a perspective view of the communication device holding system positioned for use on a flat surface;

FIG. 7 is a front perspective view of the communication device holding system with a smartphone held in a horizontal face-forward orientation;

FIG. 8 is a front perspective view of the communication device holding system with a smartphone held in a vertical face-forward orientation;

FIG. 9 is a front perspective view of the communication device holding system with a smartphone held in a horizontal face-up orientation;

FIG. 10 is an isolated front view of a cooperating shirt that can be included as part of the communication device holding system in accordance with another embodiment of the present invention;

FIG. 11 is an isolated cross-sectional view of a portion of the front of the cooperating shirt illustrating the two open-ended tubes coupled thereto in accordance with an embodiment of the present invention;

FIG. 12 is a back view of the cooperating shirt; and

DETAILED DESCRIPTION OF THE INVENTION

Figure 1:
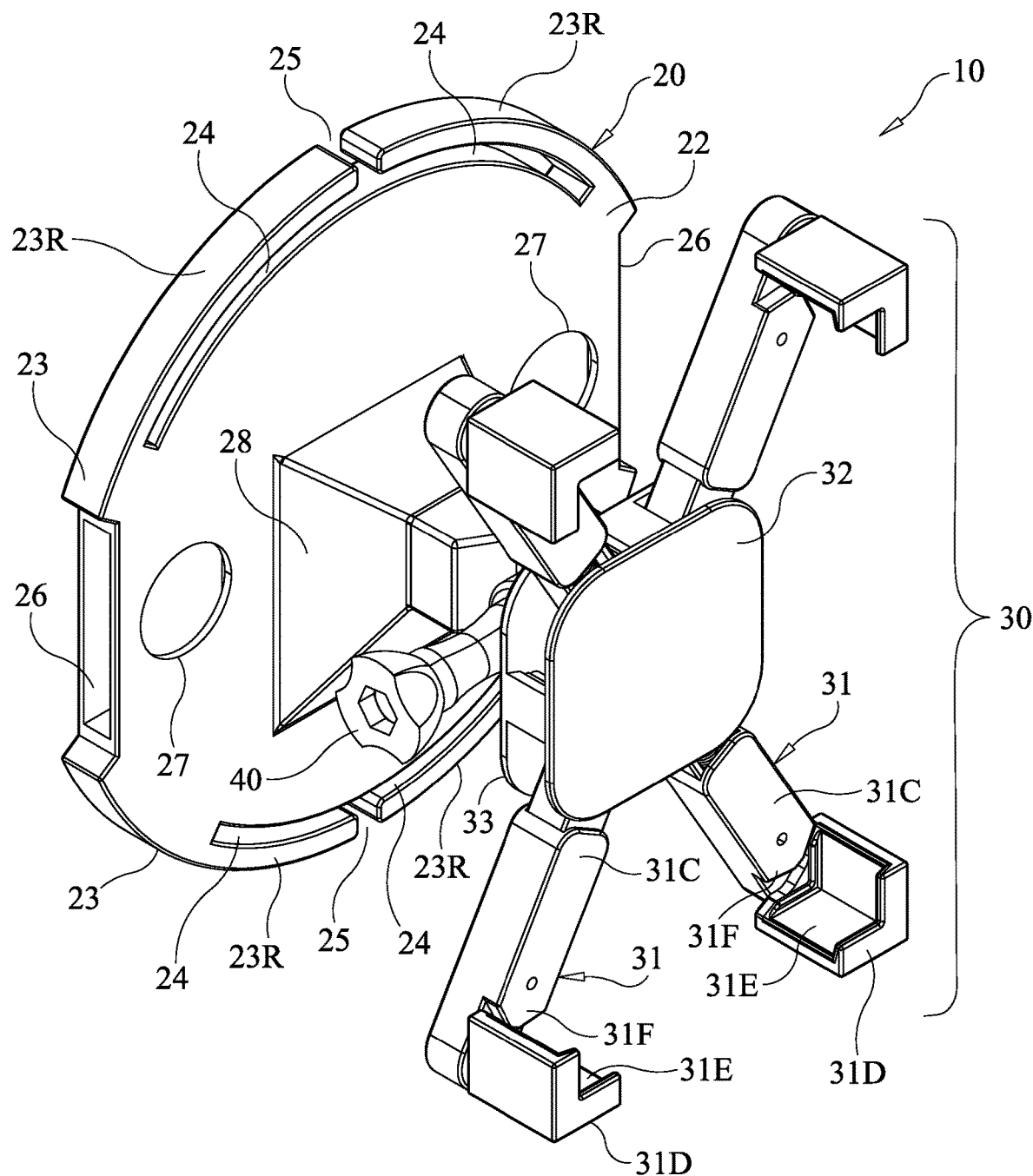
FIG. 1 is a front perspective view of a communication device holding system in accordance with an embodiment of the present invention.
Figure 2:
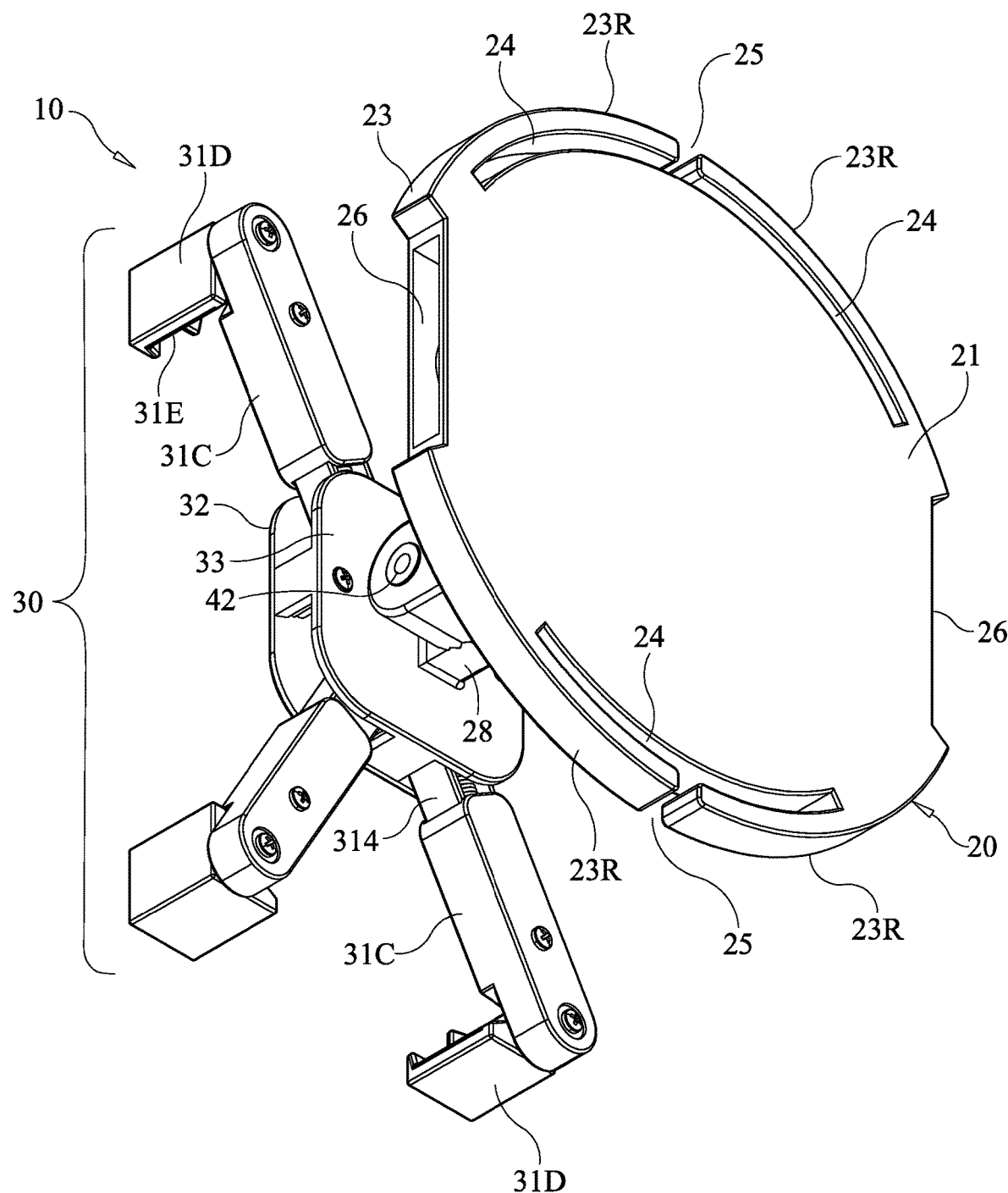
FIG. 2 is a back perspective view of the communication device holding system.
Figure 3:
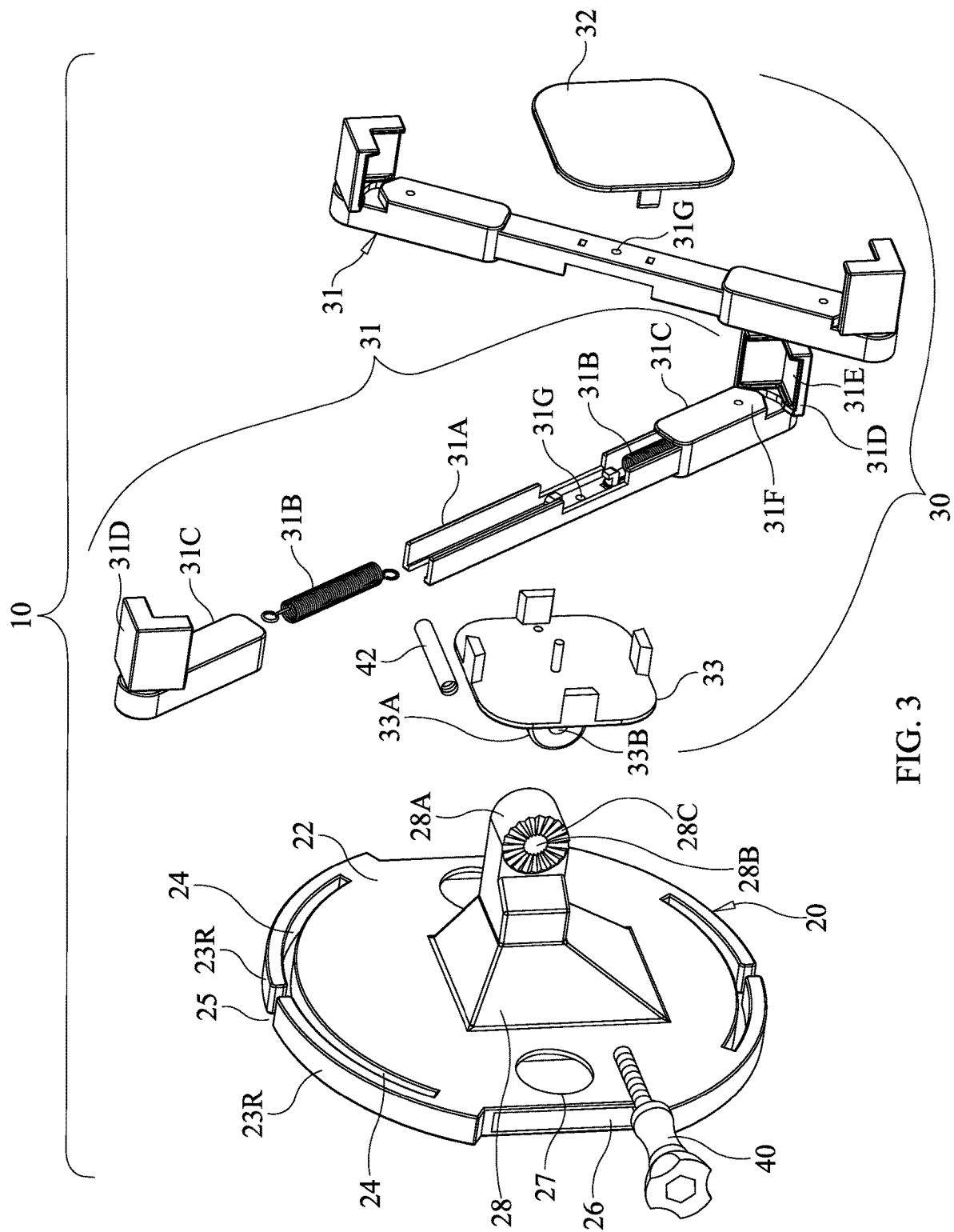
FIG. 3 is an exploded view of the communication device holding system in accordance with an embodiment of the present invention.

Referring now to the drawings, simultaneous reference will be made to FIGS. 1-3 where a communication device holding system in accordance with the present invention is shown and is referenced generally by numeral 10. Holding system 10 is illustrated in a front perspective view in FIG. 1, a back perspective view in FIG. 2, and an exploded view in FIG. 3. It is to be understood that the illustrated embodiment is exemplary and that the novel features of holding system 10 can be realized by alternative structural elements without departing from the scope of the present invention. It is further to be understood that holding system 10 can be used with a variety of communication devices without departing from the scope of the present invention. However, given the ubiquitous nature of smartphones, holding system 10 will be described herein with reference to its use with a smartphone. Holding system 10 can be made from a variety of lightweight and strong materials, and typically will utilize different materials depending on their function as would be readily understood by one of ordinary skill in the art.

Holding system 10 includes a rigid support base 20 and a size-adaptable arm assembly 30 coupled to base 20 by, for example, a threaded bolt 40. In general, base 20 is made from one or more rigid materials such as a rigid plastic, metal, or composite. Base 20 has a planar back face 21, a front or mounting face 22 in opposition to back face 21, and a peripheral edge 23 extending around base 20 between faces 21 and 22. Base 20 is further configured to have two slots 24 passing completely through base 20 adjacent to peripheral edge 23. That is, slots 24 extend from back face 21 to mounting face 22 with regions 23R of peripheral edge 23 being adjacent to each slot 24. In the illustrated embodiment, slots 24 are disposed at diametrically opposing sides of base 20. Peripheral edge 23 at regions 23R can be convexly curved (as shown) or straight without departing from the scope of the present invention. Peripheral edge 23 is discontinuous at each of two portions thereof to define openings 25, each of which is in open communication with their corresponding slot 24. Openings 25 extend through base 20 from back face 21 to mounting face 22. Openings 25 can be centrally positioned along the length of their corresponding slots 24 (as shown), but can also be positioned at other places along the length of slots 24 without departing from the scope of the present invention.

For the illustrated embodiment, base 20 also defines an open-ended passageway 26 to allow a belt (not shown) to be passed there through to thereby allow holding system 10 to be positioned and held at the waist region of a user or around the user's chest. The belt can be a conventional belt or one supplied with holding system 10 without departing from the scope of the present invention. For example and as shown in FIG. 5, a belt 50 can have end clips 51 configured to engage with base 20. As illustrated, each of clips 51 includes a spring-biased tab 52 to engage a hole 27 in mounting face 22 where hole 27 extends to passageway 26. When clip 51 is inserted into passageway 26, tab 52 is pressed against its spring bias. When tab 52 is aligned with hole 27, the spring bias of tab 52 causes it to engage with hole 27 to thereby retain clip 51 in base 20. The process is reversed to disengage clip 51 from base 20. Belt 50 can have one or more holes 53 passing there through to facilitate attachment of ancillary devices such as a key ring.

Base 20 also includes a support 28 that can be integrated with or attached to mounting face 22 of base 20. In general, support 28 provides for the removable attachment and adjustable positioning of arm assembly 30. For example, in the illustrated embodiment, the outboard end 28A of support 28 has a through hole 28B surrounded by teeth 28C that will engage and mesh with corresponding teeth on a component of arm assembly 30 as will be explained further below. The teeth provide for the adjustment and retention of a selected position of arm assembly 30 relative to support 28. The selected position of arm assembly 30 is retained, for example, by a threaded bolt 40 engaging with a threaded insert 42 as will be explained further below.

Arm assembly 30 includes two spring-biased arms 31 pivotally coupled to one another at their centers and held together to support the arms' pivoting relationship by front and rear cover plate 32 and 33, respectively. Cover plates 32 and 33 can be joined together to capture arms 31 there between in a variety of ways without departing form the scope of the present invention. Rear cover plate 33 (also illustrated in an isolated view thereof in FIG. 4) includes a hinge plate 33A with a through hole 33B. Plate 33A has teeth 33C surrounding hole 33B that are configured to mesh with the above-described teeth 28C on support 28. When through holes 28B and 33B are aligned with one another, portions of bolt 40 and threaded insert 42 pass through some or all of aligned holes 28B and 33B where they can engage one another to fix plate 33A in a selected position relative to support 28. Cover plates 32 and 33 can snap together or be held together by fasteners or adhesive without departing from the scope of the present invention.

Each of arms 31 is identically constructed with one of arms 31 being illustrated in its assembled condition and one being illustrated in an exploded view thereof. Each arm 31 includes a central portion 31A for housing one or more spring(s) 31B therein, end portions 31C sliding over ends of central portion 31A with each end portion 31C coupled to an end of spring 31B, and a corner brace 31D and corner pad or cushion 31E coupled to the outbound end of each end portion 31C. Corner braces 31D along with their pads 31E can be pivotally coupled to end portion 31C to facilitate the mounting of a smartphone (not shown in FIGS. 1-3) to arm assembly 30. Each end portion 31C can be configured to limit rotation of a connected corner brace 31D. For example, in the illustrated embodiment, end portion 31C can include an integrated boss 31F to limit rotational movement of corner brace 31D.

When holding system 10 is fully assembled using any conventional assembly hardware (not shown) and/or procedures, arms 31 can be rotated in their respective planes and relative to one another about their centers 31G, and can be extended in length against the forces of springs 31B to accommodate and cradle a variety of smartphone sizes/configurations. The cradled smartphone can then be rotated to any desired horizontal to vertical orientation by rotation of both arms 31 about their centers 31G, and can be pivoted at the mating of plate 33 to support 28 to any desired tilt orientation ranging from face-up to face-forward to face-down. Bolt 40 and threaded insert 42 are loosened to permit positioning of arm assembly 30, and tightened to lock arm assembly 30 to a desired pivot or tilt position.

Holding system 10 can be used as a device holding stand as illustrated in FIG. 6. In this configuration, back face 21 of base 20 rests on a flat surface 100 such as a table top, a shelf, a floor, etc. Arm assembly 30 is adjusted to a desired orientation relative to base 20 to provide a desired access/viewing position for a smartphone (not shown in FIG. 6) that will be cradled by arm assembly 30. A variety of exemplary smartphone orientations are illustrated in FIGS. 7-9 where a smartphone 200 is shown horizontally (i.e., landscape mode) and face-forward in FIG. 7, vertical (i.e., portrait mode) and face-forward in FIG. 8, and horizontal and face-up in FIG. 9.

As mentioned above, the holding system of the present invention can be placed on a flat surface or worn at one's waist or chest using a belt. However, the holding system can additionally include a unique cooperating shirt as will now be explained with simultaneous reference to FIGS. 10-13 where an entire holding system 12 now includes the above-described system 10 along with a unique shirt referenced by numeral 60. Shirt 60 can be a short-sleeve (as shown), long-sleeve, or sleeveless garment made from any fabric of choice without departing from the scope of the present invention. Shirt 60 can include belt loops 62 distributed around shirt 60 such that belt loops 62 reside in the general region of a user's waist when shirt 60 is worn. Belt loops 62 can also function to hold a user's valuables such as a credit card, identification, car key, etc. Belt loops 62 can be permanent (e.g., stitched in place) or user-created (e.g., using hook-and-loop fastener material without departing from the scope of the present invention.

Figure 13:
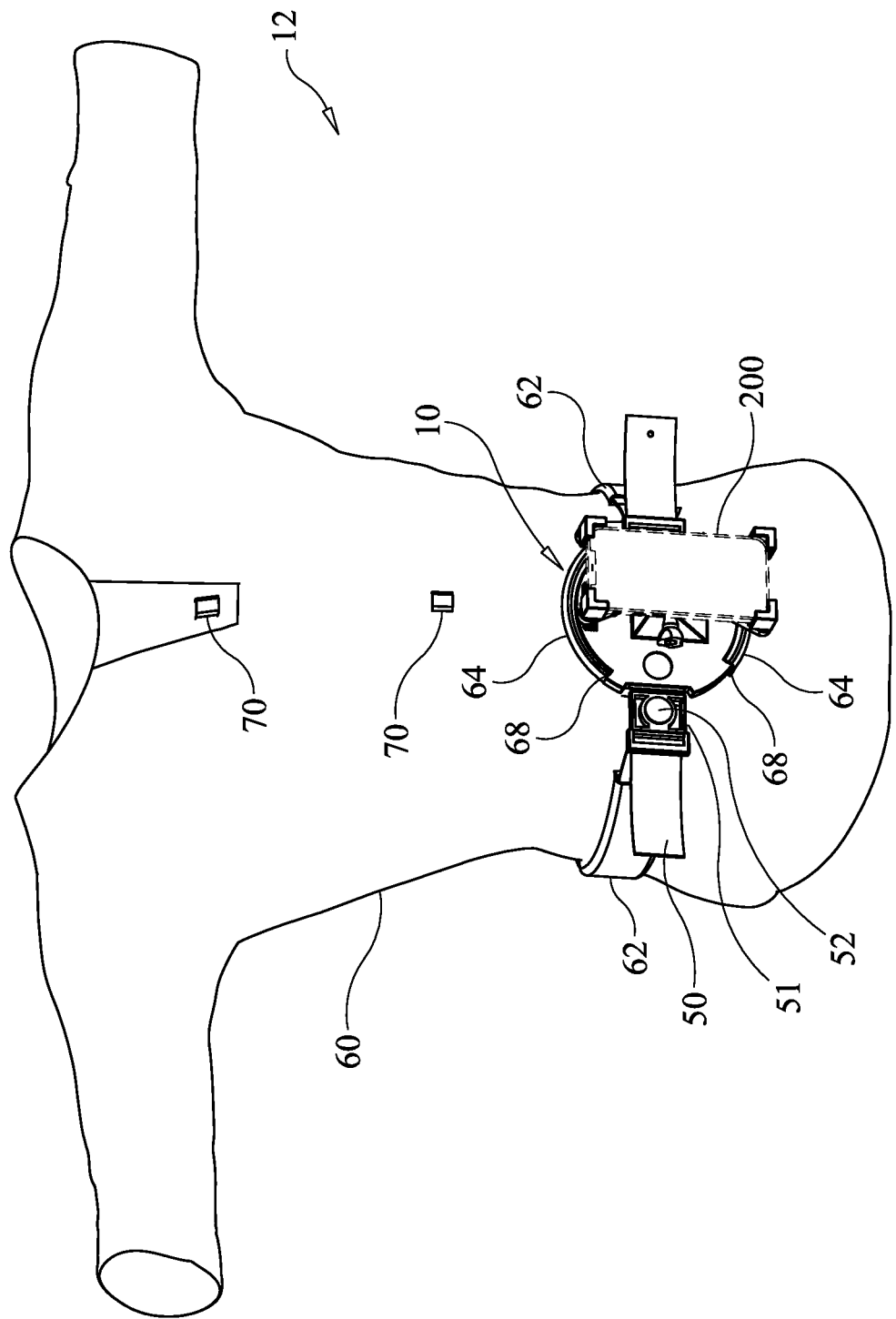
FIG. 13 is a perspective view of the communication device holding system to include the cooperating shirt.

At the front of shirt 60 at a region thereof that will cover a wearer's abdomen are spaced-apart flexible tubes 64. Tubes 64 can be permanent (e.g., stitched in place via stitches 66 illustrated in FIG. 11) or user-created (e.g., using hook-and-loop fastener material) without departing from the scope of the present invention. Each of tubes 64 is a flexible and open-ended fabric tube extending substantially horizontally across the front of shirt 60. The fabric used for tubes 64 can be the same as that used for shirt 60 or can be a different fabric without departing from the scope of the present invention. Each tube 64 cooperates with one of slots 24 on base 20. More specifically, either open end 68 of each tube 64 is pushed through one of openings 25 at peripheral edge 23 of base 20, and then base 20 is manipulated until each region 23R of peripheral edge 23 is disposed in a corresponding tube 64. One or more headphone wire loops 70 can be provided in the front of shirt 60 to provide lead points for a headphone wire (not shown) of a smartphone 200 held by system 12 as shown in FIG. 13.

The advantages of the present invention are numerous. The device holding system provides secure mounting of a smartphone that can be readily viewed and accessed when a user is physically active or is otherwise not able to hold the smartphone. Whether walking, working inside or outside, and/or training indoors or outdoors, the present invention greatly facilitates a user's desire to have their smartphone readily available. When the system includes the unique cooperating shirt, a user can readily access and view their smartphone in a hands-free fashion. Further, the shirt's upper tube provides a comfortable, non-slip resting place for one's hands when typing on the cradled smartphone. The holding system allows a user to optimally position their smartphone for recording hands-fee video. The holding system's arm assembly is readily detached from its base for portability.

Although the invention has been described relative to a specific embodiment thereof, there are numerous variations and modifications that will be readily apparent to those skilled in the art in light of the above teachings. It is therefore to be understood that, within the scope of the appended claims, the invention may be practiced other than as specifically described.

What is claimed as new and desired to be secured by Letters Patent of the United States is:

1. A communication device holding system, comprising:
    a base having a planar face, a mounting face, and a peripheral edge, said base including slots adjacent to said peripheral edge, each of said slots extending through said base from said planar face to said mounting face, said peripheral edge being discontinuous at portions thereof to define openings in said peripheral edge wherein each of said slots has one of said openings in open communication therewith and extending through said base from said planar face to said mounting face; and
    a device holder coupled to said mounting face and adapted to hold a communication device, said device holder being adjustable in position relative to said mounting face.

2. A communication device holding system as in claim 1, wherein said slots comprise two slots at diametrically opposing sides of said base.

3. A communication device holding system as in claim 2, further comprising:
    a shirt having a front;
    a first tube coupled to said front of said shirt;
    a second tube coupled to said front of said shirt and spaced-apart from said first tube;
    wherein said peripheral edge adjacent to a first of said two slots is disposed in said first tube; and
    wherein said peripheral edge adjacent to a second of said two slots is disposed in said second tube.

4. A communication device holding system as in claim 1, wherein the communication device is a smartphone, and wherein said device holder includes a plurality of movable arms adapted to cradle the smartphone.

5. A communication device holding system as in claim 1, further comprising:
    a wearable garment; and
    at least one tube coupled to said garment for engagement in one of said slots via said one of said openings associated therewith.

6. A communication device holding system as in claim 5, wherein said garment comprises a shirt.

7. A communication device holding system as in claim 1, further comprising an adjustable-length belt having ends coupled to diametrically opposing sides of said base.

8. A communication device holding system, comprising:
    a base having a planar face, a mounting face, and a peripheral edge, said base including slots adjacent to said peripheral edge, each of said slots extending through said base from said planar face to said mounting face, said peripheral edge being discontinuous at portions thereof to define openings in said peripheral edge wherein each of said slots has one of said openings in open communication therewith and extending through said base from said planar face to said mounting face;
    a support coupled to said mounting face and extending away therefrom, said support terminating in an outboard end; and
    a device holder adjustably and removably coupled to said outboard end of said support, said device holder adapted to cradle a communication device, wherein said support and said device holder set a position of the communication device relative to said mounting face.

9. A communication device holding system as in claim 8, wherein said slots comprise two slots at diametrically opposing sides of said base.

10. A communication device holding system as in claim 9, further comprising:
a shirt having a front;
an open-ended first tube coupled to said front of said shirt and extending horizontally across a portion of said shirt adapted to cover a wearer's abdomen;
an open-ended second tube coupled to said front of said shirt and extending horizontally across the portion of the shirt adapted to cover the wearer's abdomen in a spaced-apart relationship with said first tube;
wherein said peripheral edge adjacent to a first of said two slots is disposed in said first tube; and
wherein said peripheral edge adjacent to a second of said two slots is disposed in said second tube.

11. A communication device holding system as in claim 8, wherein the communication device is a smartphone, and wherein said device holder includes a plurality of movable arms adapted to cradle the smartphone.

12. A communication device holding system as in claim 8, further comprising:
a wearable garment; and
at least one open-ended tube coupled to said garment for engagement in one of said slots via said one of said openings associated therewith.

13. A communication device holding system as in claim 12, wherein said garment comprises a shirt.

14. A communication device holding system as in claim 8, further comprising an adjustable-length belt having ends coupled to diametrically opposing sides of said base.

15. A communication device holding system, comprising:
a base having a planar face, a mounting face, and a peripheral edge, said base including slots adjacent to said peripheral edge, each of said slots extending through said base from said planar face to said mounting face, said peripheral edge being discontinuous at portions thereof to define openings in said peripheral edge wherein each of said slots has one of said openings in open communication therewith and extending through said base from said planar face to said mounting face; and
a device holder coupled to said mounting face, said device holder including a plurality of arms, each of said arms being extendable in length in opposition to a spring bias, each of said arms terminating in a rotating brace adapted to cradle a corner of a smartphone.

16. A communication device holding system as in claim 15, wherein said slots comprise two slots at diametrically opposing sides of said base.

17. A communication device holding system as in claim 16, further comprising:
a shirt having a front;
an open-ended and flexible first tube coupled to said front of said shirt and extending horizontally across a portion of said shirt adapted to cover a wearer's abdomen;
an open-ended and flexible second tube coupled to said front of said shirt and extending horizontally across the portion of the shirt adapted to cover the wearer's abdomen in a spaced-apart relationship with said first tube;
wherein said peripheral edge adjacent to a first of said two slots is disposed in said first tube; and
wherein said peripheral edge adjacent to a second of said two slots is disposed in said second tube.

18. A communication device holding system as in claim 15, further comprising:
a wearable garment; and
at least one open-ended tube coupled to said garment for engagement in one of said slots via said one of said openings associated therewith.

19. A communication device holding system as in claim 18, wherein said garment comprises a shirt.

20. A communication device holding system as in claim 15, further comprising an adjustable-length belt having ends coupled to diametrically opposing sides of said base.

* * * * *